(12) United States Patent
Deng

(10) Patent No.: US 11,749,181 B2
(45) Date of Patent: Sep. 5, 2023

(54) LIGHT-EMITTING DIODE DISPLAY

(71) Applicant: EPISTAR CORPORATION, Hsinchu (TW)

(72) Inventor: Shao-You Deng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 17/676,749

(22) Filed: Feb. 21, 2022

(65) Prior Publication Data

US 2022/0180804 A1   Jun. 9, 2022

Related U.S. Application Data

(63) Continuation of application No. 16/700,515, filed on Dec. 2, 2019, now Pat. No. 11,257,420.

(30) Foreign Application Priority Data

Dec. 26, 2018   (TW) .................. 107147253

(51) Int. Cl.
G09G 3/32        (2016.01)
H01L 33/36       (2010.01)
H01L 33/52       (2010.01)

(52) U.S. Cl.
CPC ............. G09G 3/32 (2013.01); H01L 33/36 (2013.01); H01L 33/52 (2013.01)

(58) Field of Classification Search
CPC .. G09G 3/32; G09G 2300/0426; H01L 33/36; H01L 33/52; H01L 25/0753; H01L 33/62; H01L 33/483; H01L 33/44; G09F 9/33
See application file for complete search history.

(56) References Cited

U.S. PATENT DOCUMENTS

| | | | |
|---|---|---|---|
| 9,356,070 B2 | 5/2016 | Hsieh et al. | |
| 2010/0062553 A1 | 3/2010 | Sung et al. | |
| 2010/0155751 A1 | 6/2010 | Kuo et al. | |
| 2011/0260166 A1 | 10/2011 | Kim | |
| 2011/0303930 A1 | 12/2011 | Bang et al. | |
| 2012/0223345 A1 | 9/2012 | Tomoda et al. | |
| 2014/0048825 A1 | 2/2014 | Hsieh et al. | |
| 2014/0085250 A1 | 3/2014 | Cok | |
| 2014/0186979 A1 | 7/2014 | Tu et al. | |
| 2016/0155892 A1* | 6/2016 | Li ................... | H01L 25/0753 257/89 |
| 2017/0069868 A1 | 3/2017 | Hirakata et al. | |
| 2018/0151630 A1 | 5/2018 | Yamaoka et al. | |

* cited by examiner

*Primary Examiner* — Abhishek Sarma

(74) *Attorney, Agent, or Firm* — Patterson + Sheridan, LLP

(57) ABSTRACT

This disclosure discloses a display including a first carrier, a second carrier, a light-emitting unit, a frame, and a protective layer. The first carrier includes a first electrode and a second electrode. The second carrier is arranged below the first carrier and includes a first connection pad and a second connection pad arranged on a side of the second carrier close to the first carrier. The light-emitting unit is arranged on the first carrier. The frame surrounds the light-emitting unit, and the protective layer covers the light-emitting unit. A distance between the first electrode and the second electrode is smaller than that between the first connection pad and the second connection pad.

10 Claims, 8 Drawing Sheets

LIGHT-EMITTING DIODE DISPLAY

REFERENCE TO RELATED APPLICATION

This application is a continuation application of U.S. application Ser. No. 16/700,515, filed Dec. 2, 2019, which claims the benefit of Taiwan Application Serial No. 107147253, filed on Dec. 26, 2018, the content of which is hereby incorporated by reference in its entirety.

BACKGROUND

Technical Field

The present disclosure relates to a light-emitting diode display and its manufacturing method, especially to a light-emitting diode display including two carriers.

Description of the Related Art

Since the light-emitting diode can emit colorful lights, the advanced light-emitting diode display can use light-emitting diodes as pixels so an additional backlight module is not required, which is different from the structure of a conventional liquid crystal display using a backlight module as the light source in the display. Because the light-emitting diode display can be lighter and thinner than the conventional liquid crystal display, it has considerable commercial potential.

SUMMARY OF THE DISCLOSURE

This disclosure discloses a display comprising a first carrier, a second carrier, a light-emitting unit, a frame, and a protective layer. The first carrier has a first electrode and a second electrode. The second carrier is formed below the first carrier and has a first connection pad and a second connection pad. The light-emitting unit is formed on the first carrier and is electrically connected to the first electrode. The frame surrounds the light-emitting unit. The protective layer covers the light-emitting unit. A distance between the first connection pad and the second connection pad is larger than the distance between the first electrode and the second electrode.

This disclosure discloses a display comprising a first carrier, a second carrier, a third carrier, a first light-emitting unit, a second light-emitting unit, a frame, and a protective layer. The second carrier is arranged on the first carrier. The third carrier is arranged on the first carrier and is not directly contacted with the second carrier. The first light-emitting unit is formed on the second carrier. The second light-emitting unit is formed on the third carrier. The frame surrounds the first light-emitting unit. The protective layer covers the first light-emitting unit.

This disclosure discloses a display comprising a first carrier, a second carrier, a first light-emitting unit, a frame, and a protective layer. The second carrier is formed below the first carrier and has a first cavity. The first light-emitting unit is formed on the first carrier. The frame surrounds the first light-emitting unit. The protective layer covering the first light-emitting unit.

BRIEF DESCRIPTION OF THE DRAWING

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure accompanied with the drawings.

Figure 1:
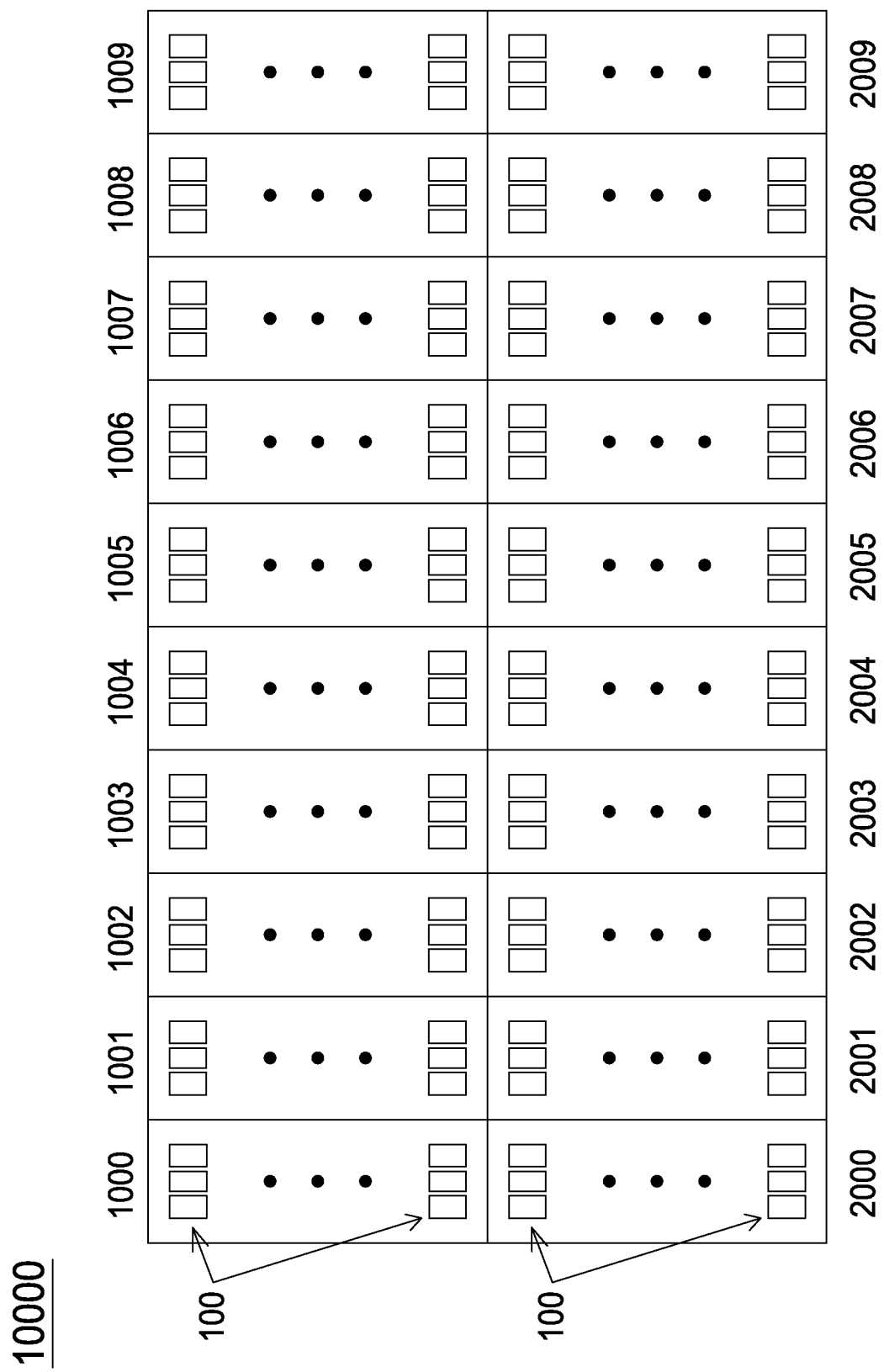
FIG. 1 shows a schematic view of a light-emitting diode display in accordance with one embodiment of the present disclosure.

FIG. 1 shows a schematic view of a light-emitting diode display in accordance with one embodiment of the present disclosure. The light-emitting diode display 10000 has display units 1000~1009 and 2000~2009, and each of the display units further includes multiple pixel units 100. The pixel unit 100 can be independently controlled to emit a light with specific light intensity and color. The pixel units 100 in the display unit have same or similar optical properties, such as light intensity and light-emitting angle. The number of the display units arranged in a horizontal row in the light-emitting diode display 10000 is different from that of the display units arranged in a vertical column in the light-emitting diode display 10000. To be specific, there are 10 display units, such as display units 1000~1009, arranged in a horizontal row and 2 display units, such as display units 1000 and 2000, arranged in a vertical column in the light-emitting diode display 10000.

Figure 2A:
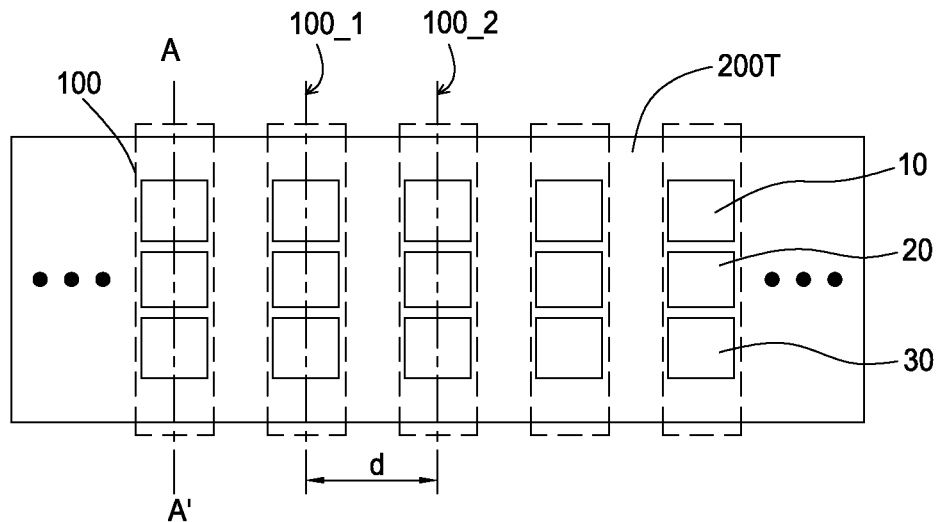
FIG. 2A shows a schematic view of a display unit in accordance with one embodiment of the present disclosure.

FIG. 2A shows a schematic view of a display unit in accordance with one embodiment of the present disclosure. Referring to FIG. 2A, the display unit 10000 includes pixel units 100, 100_1, 100_2, and each of the pixel units 100, 100_1, 100_2 has light-emitting units 10, 20, 30 arranged along a line AA'. In other words, the line AA' shows the direction of the arrangement of the light-emitting units in the pixel unit. The pixel units 100, 100_1, 100_2 are arranged at a fixed interval. The pixel units 100, 100_1, 100_2 are arranged in a direction perpendicular to the line AA' as shown in FIG. 2A. The number of the pixel units 100 can be adjusted according to the requirements of different applications. For example, in an embodiment, the number of the pixel units in the display unit is sufficient to provide a resolution of 1920×1080. As shown in FIG. 2A, the pixel unit 100_1 and the pixel unit 100_2 are spaced by a pixel pitch d. In an embodiment, the pixel pitch d is between 0~1.4 mm, such as 0.2 mm, 0.75 mm, 0.8 mm, 1 mm, 1.25 mm, and 1.3 mm. The pixel unit 100 includes a red light-emitting unit 10, a green light-emitting unit 20, and a blue light-emitting unit 30 arranged in a direction parallel to the line AA'. In another embodiment, the arrangement of the light-emitting units can be adjusted according to the needs of different applications. For example, the light-emitting units can be arranged from top to bottom in a sequence of a red light-emitting unit 10, a blue light-emitting unit 30 and a green light-emitting unit 20.

Figure 2B:
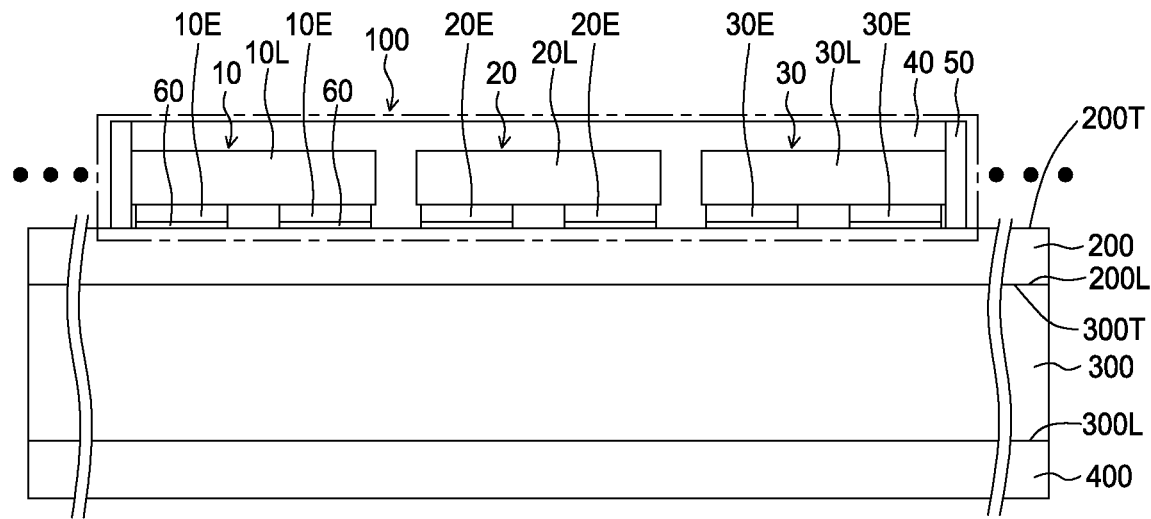
FIG. 2B shows a cross-sectional view of a display unit in FIG. 2A.

FIG. 2B shows a cross-sectional view of a display unit along line AA' in FIG. 2A. The display unit 1000 has an electrical contact layer 400, a first carrier 200, a second carrier 300, and a pixel unit 100. The first carrier 200 has a top surface 200T and a bottom surface 200L. The second carrier 300 has a top surface 300T and a bottom surface 300L. The hardness of the second carrier 300 is larger than the hardness of the first carrier 200. The pixel unit 100 has a conductive layer 60, a frame 50, a red light-emitting unit 10, a green light-emitting unit 20, and a blue light-emitting unit 30 surrounded by the frame 50, and a protective layer 40. The protective layer 40 is directly connected to the inner side of the frame 50. In other words, the side of the frame 50 near the light-emitting units is connected to the protective layer 40. The topmost surface of the protective layer 40 and the topmost surface of the frame 50 are substantially coplanar with each other. The protective layer 40 covers and directly connects to the light-emitting units. In an embodiment, the protective layer 40 is formed within the pixel unit 100 and is not formed between different pixel units. Therefore, the protective layer 40 only connects to the inner side of the frame 50 (or connects to the side of the frame 50 near the light-emitting units). In an embodiment, the protective layer 40 entirely covers the display unit 1000 or at least cover multiple pixel units 100. Therefore, the protective layer 40 contacts both the inner side and the outer side (or the side away from the light-emitting units) of the frame 50. The protective layer 40 also covers the topmost surface of the frame 50.

The light-emitting units 10, 20, 30 in FIG. 2B are electrically connected to the wires (not shown) on the surface of the first carrier 200 through the conductive layer 60. The light-emitting units 10, 20, 30 are electrically connected to the electrical contact layer 400 through the conductive wires (not shown) on the surface of the first carrier 200, the conductive wires (not shown) in the first carrier 200 and the conductive wires (not shown) in the second carrier 300 to receive external control signals and emit lights according to the external control signals. The conductive wires (not shown) in the first carrier 200 and the conductive wires (not shown) in the second carrier 300 can vertically or obliquely pass through the first carrier 200 or the second carrier 300. The conductive layer 60 has conductive material, such as solder, anisotropic conductive film (ACF), or anisotropic conductive paste (ACP).

The light emitting unit 10, 20, 30 includes a light emitting semiconductor stack 10L, 20L, 30L and an electrode 10E, 20E, 30E, respectively. The light emitting semiconductor stack 10L, 20L, 30L includes a substrate (not shown), a first type semiconductor layer (not shown, such as an n-type semiconductor layer), an active layer (not shown), and a second type semiconductor layer (not shown, such as a p-type semiconductor layer). In one embodiment, the light emitting semiconductor stacks 10L, 20L, 30L have different contours, for example, the upper surfaces of at least two of the light emitting semiconductor stacks 10L, 20L, 30L have different roughness, or at least two of the light emitting semiconductor stacks 10L, 20L, 30L have different sizes. The substrate can be a substrate for growing the first type semiconductor layer, the active layer, and the second type semiconductor layer. The substrate can include sapphire, SiC, GaN, or GaAs. The substrate can also be a substrate not for epitaxy growth. In an embodiment, the substrate is a hard substrate and includes ceramic or sapphire. In an embodiment, the substrate is a flexible substrate and includes glass fiber or bismaleimide triazine (BT) resin. The substrate can be thinned or removed during the manufacturing process of the light emitting semiconductor stack. Each of the electrodes 10E, 20E, 30E is electrically connected to the first type semiconductor layer and the second type semiconductor layer to electrically connect to an external power. The electrode can be single layer or stacked multiple layers. The electrode can include metal, such as Cu, Ni, Au, Ag, Ti, Wu, and Co. The first type semiconductor layer and the second type semiconductor layer can be cladding layer or confinement layer to provide electronics and holes to be combined within the active layer for emitting light. The first type semiconductor layer, the active layer, and the second type semiconductor layer can include a semiconductor layer including III-V group semiconductor material to emit an incoherent light. The III-V group semiconductor material can be $Al_xIn_yGa_{(1-x-y)}N$ or $Al_xIn_yGa_{(1-x-y)}P$, wherein $0 \leq x, y \leq 1$; $(x+y) \leq 1$. The light emitting semiconductor stack can emit a red light with a peak wavelength or dominant wavelength between 610 and 650 nm, emit a green light with a peak wavelength or dominant wavelength between 495 and 570 nm, or emit a blue light with a peak wavelength or dominant wavelength between 450 and 495 nm according to the material of the active layer. In an embodiment, the light emitting unit has a wavelength conversion material, such as dye, phosphor, quantum dot material, or combinations thereof. In an embodiment, the light emitting unit includes phosphor as a wavelength conversion material. In an embodiment, some neighboring phosphor particles in the light emitting unit are contacted with each other while some neighboring phosphor particles are not. The average or maximum diameter of the phosphor particle is between 5 μm and 100 μm. The phosphor can be yellow-greenish phosphor or red phosphor. The yellow-greenish phosphor includes aluminum-oxide (such as YAG or TAG), silicate, vanadate, alkaline-earth metal selenide, or metal nitride. The red phosphor includes silicate, vanadate, alkaline-earth metal sulfide, metal oxynitride, or a mixture of tungstate and molybdate. In an embodiment, an insulating layer including cured white paint is arranged between the substrate and the active layer. The white paint has a viscosity about 0.5~1000 Pa·s and a Shore D Hardness between 40~90. Or, the white paint has a viscosity about 100~1000 Pa·s and a Shore D Hardness between 30~60. The white paint includes a base material and multiple reflective particles (not shown) dispersed within the base material. The base material has silicone-based material, epoxy-based material or combinations thereof and a refractive index between 1.4 and 1.6 or between 1.5 and 1.6. The base material may include polyimide (PI), benzocyclobutene (BCB), perfluorocyclobutane (PFCB), polymethyl methacrylate (PMMA), polyethylene terephthalate (PET), polycarbonate (PC), polyetherimide, or fluorocarbon polymer. The reflective particle can include titanium dioxide, ceria, alumina, zinc oxide, or zirconium dioxide. When the light from the active layer hits the insulating layer, the light is reflected. To be specific, the reflection induced on the insulating layer is diffuse reflection.

The protective layer 40 can be penetrated by the light emitted from the light-emitting unit. The material of the protective layer 40 can include silicone, epoxy, polyimide, benzocyclobutene (BCB), perfluorocyclobutane (PFCB), SU8, acrylic resin, polymethyl methacrylate (PMMA), polyethylene terephthalate (PET), polycarbonate (PC), polyetherimide, fluorocarbon polymer, alumina, SINR, or spin-on glass (SOG). In an embodiment, the protective layer 40 includes scattering particles, such as titanium dioxide, zirconium oxide, zinc oxide, or aluminum oxide.

The frame 50 absorbs a part of the light from the pixel unit to prevent light emitting in a lateral direction from the pixel unit. Therefore, the light from the pixel unit mainly leaves the pixel unit in a direction perpendicular with the top surface 200T of the first carrier 200 to concentrate the light emitting direction. The top surface 200T of the first carrier 200 is directly connecting to the light-emitting units 10, 20, 30. The frame 50 can absorb light when it is composed of an opaque material. The fame 50 can be a structure having a base material coated with a black paint or a structure having mixed base material and black paint. The base material has metal (such as chromium) or a polymer. The polymer can be silicone, epoxy resin, polyiminamide, benzocyclobutene (BCB), perfluorocyclobutane (PFCB), Su8, acrylic resin, polymethyl methacrylate (PMMA), polyethylene terephthalate (PET), polycarbonate (PC), polyetherimide, polyurethane (PU), polydimethyl siloxane (PDMS), acrylate, or bismaleimide triazine (BT) resin. The black paint can be a black ink or a dark pigment having carbon or titanium oxide. In an embodiment, the frame 50 has resin and titanium oxide within the resin. The titanium oxide is used to absorb light. The weight percentage of the titanium oxide relative to the frame 50 is not less than 60%, and in another embodiment, the weight percentage of the titanium oxide relative to the frame 50 is between 20% and 60%. In an embodiment, the thickness of the frame 50 is between 10 and 50 μm.

The first carrier 200 can be a bendable carrier. In an embodiment, the radius curvature of the first carrier 200 is less than 50 mm, such as 25 mm or 32 mm. The first carrier can include polyester, polyimide (PI), bismaleimide triazine (BT) resin or polytetrafluorothylene resin. The glass transition temperature of the bismaleimide triazine (BT) resin is 180° C. The glass transition temperature of the polyimide is 250° C., and the polyimide has a better thermal stability. The second carrier 300 includes stacked multiple layers, and each single layer has conductive wires arranged in a same profile or different profiles. The stacked multiple layers in the second carrier 300 are electrically connected with each other. The second carrier 300 can include hard material, such as phenol resin (PF), glass fiber or FR4. In an embodiment, the first carrier 200 is provided with a metal pad having a length between 50 μm and 60 μm at a position corresponding to the conductive layer 60, and the second carrier 300 is provided with a metal pad having a length of between 55 μm and 85 μm at a position below each of the light-emitting units 10, 20, 30. For example, a metal pad having a size of 50 μm×50 μm is arranged on the first carrier 200 at a position corresponding to the conductive layer 60, and a metal pad having a size of 75 μm×75 μm is arranged on the second carrier 300 at a position below each of the light-emitting units 10, 20, 30. Furthermore, the metal pad on the second carrier 300 can be arranged at the position corresponding to the conductive layer 60 or at the position not corresponding to the conductive layer 60. Referring to FIG. 2B, the conductive wires within the display unit 1000 are separated to the first carrier 200 and on the second carrier 300. Because the first carrier 200 and the second carrier 300 are stacked, the conductive wires can be separately arranged on the first carrier 200 and on the second carrier 300 to reduce wire density and lower the difficulty of arranging the conductive wires comparing with the arrangement of the conductive wires on one carrier. Furthermore, the light-emitting units can be connected to the metal pads having smaller size on the first carrier 200. Comparing with the connection between light-emitting units and metal pads having larger size on the second carrier 300, more metal pads can be provided on the first carrier 200 when connecting light-emitting units and metal pads having smaller size on the first carrier 200. In other words, under the same surface area, more light-emitting units can be arranged on the metal pads provided on the first carrier 200 to provide a higher resolution. In another aspect, while arranging same number of light-emitting units on the first carrier 200 and on the second carrier 300 of same surface area, since the total area occupied by the metal pads on the first carrier 200 is smaller, more space on the first carrier 200 can be used by the conductive wires. Therefore, the difficulty of arranging the conductive wires is reduced, and the signal interference between conductive wires can be avoided. The electrical contact layer 400 can be single layer or stacked multiple layers including metal, such as Cu, Ni, Au, Ag, Ti, W or Co.

Figure 3A:
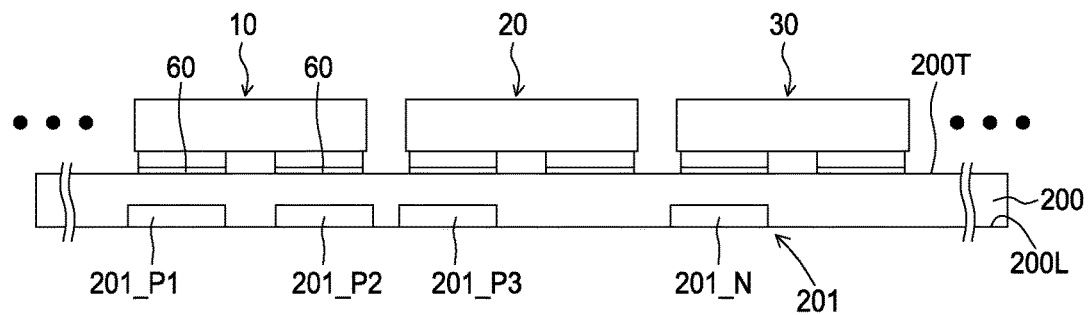
FIG. 3A shows a schematic view of manufacturing a display unit in accordance with one embodiment of the present disclosure.
Figure 3B:
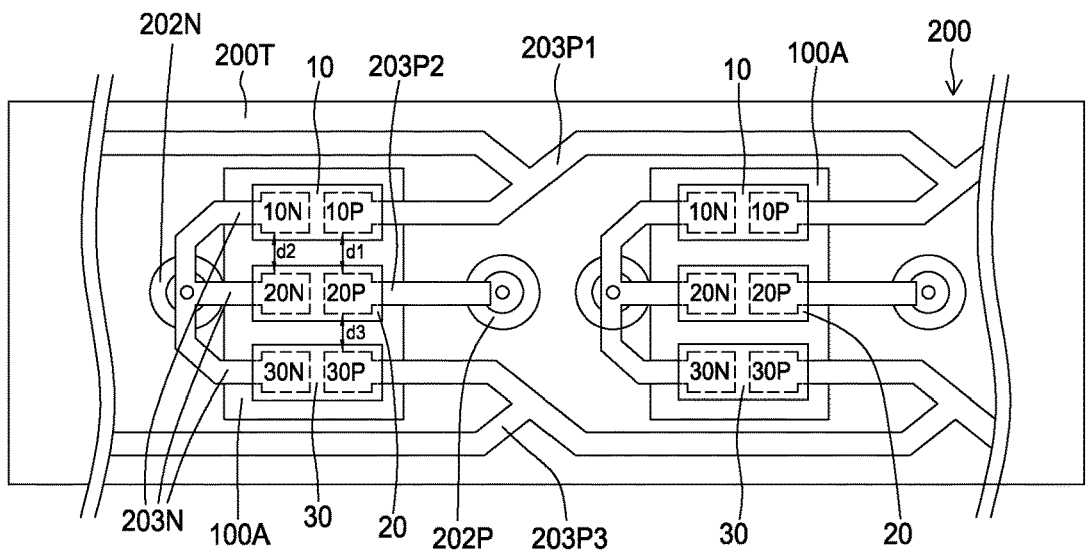
FIG. 3B shows a schematic view of a portion of the top surface of the first carrier in FIG. 3A.
Figure 3C:
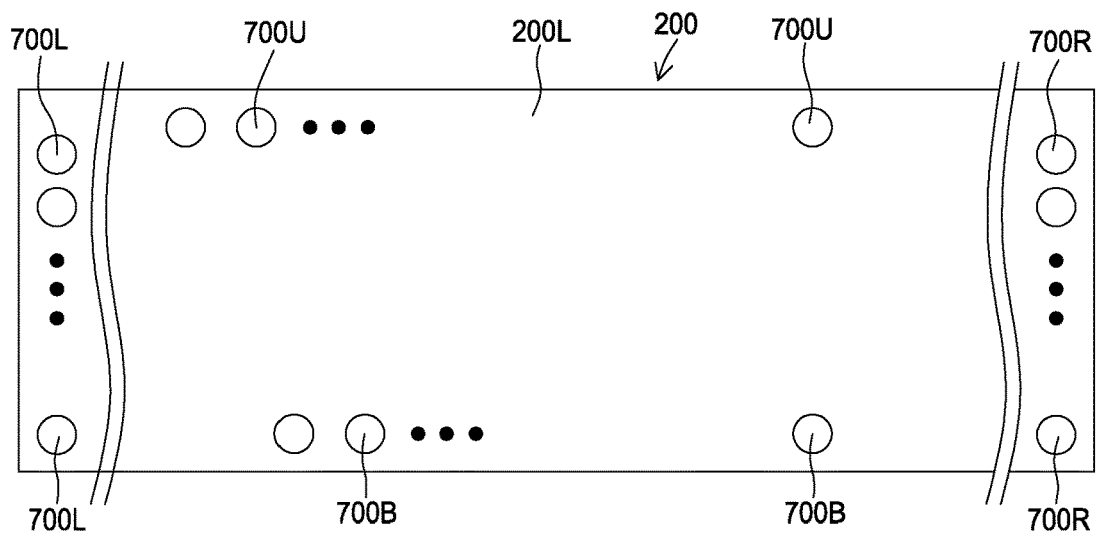
FIG. 3C shows a schematic view of a portion of the bottom surface of the first carrier in FIG. 3A.

FIG. 3A show a schematic view of manufacturing a display unit in accordance with one embodiment of the present disclosure. FIG. 3B shows a schematic view of a portion of the top surface of the first carrier in FIG. 3A. FIG. 3C shows a schematic view of a portion of the bottom surface of the first carrier in FIG. 3A. Referring to FIG. 3A, the light-emitting units 10, 20, 30 are arranged on the top surface 200T of the first carrier 200. An electrical contact layer 201 is arranged on the bottom surface 200L of the first carrier 200. The electrical contact layer 201 is electrically connected to the conductive wire on the top surface 200T of the first carrier 200 to provide an electrical path between the light-emitting unit and an external power. The conductive wire includes the n-type connection pad 202N, the p-type connection pad 202P, the n-type wire 203N and the p-type wires 203P1, 203P2, 203P3 shown in FIG. 3B. The electrical contact layer 201 has an n-type connection pad 201_N and p-type connection pads 201_P1, 201_P2, 201_P3. The sizes of the n-type connection pad and the p-type connection pad can be the same or different. The n-type connection pad 201_N is electrically connected to the n-type semiconductor layers of the light-emitting units 10, 20, 30 to form a common n-type platform. The p-type connection pad 201_P1 is electrically connected to the p-type semiconductor layer of the light-emitting units 10. The p-type connection pad 201_P2 is electrically connected to the p-type semiconductor layer of the light-emitting units 20. The p-type connection pad 201_P3 is electrically connected to the p-type semiconductor layer of the light-emitting units 30. In another embodiment, the p-type semiconductor layers of the light-emitting units 10, 20, 30 are commonly connected to the same p-type connection pad to form a common p-type platform, and the n-type semiconductor layers of the light-emitting units 10, 20, 30 are connected to different n-type connection pads. In another embodiment, the light-emitting units 10, 20, 30 are formed in a form of a package to be arranged on the first carrier 200. FIG. 3B shows a schematic view of a portion of the top surface of the first carrier in FIG. 3A. Referring to FIG. 3B, the light-emitting units 10, 20, 30 are arranged in the pixel area 100A, and each light-emitting unit is connected to one n-type electrode and one p-type electrode. To be more specific, the light-emitting unit 10 is electrically connected to the p-type electrode 10P and the n-type electrode 10N, the light-emitting unit 20 is electrically connected to the p-type electrode 20P and the n-type electrode 20N, and the light-emitting unit 30 is electrically connected to the p-type electrode 30P and the n-type electrode 30N. The distance between two neighboring p-type electrodes is substantially the same as that between two neighboring n-type electrodes. For example, the distance d1 between the electrode 10P and the electrode 20P is substantially the same as the distance d2 between the electrode 10N and the electrode 20N. The distance between two neighboring electrodes of same type is substantially the same. For example, the distance d1 between the electrode 10P and the electrode 20P is substantially the same as the distance d3 between the electrode 20P and the electrode 30P. The n-type electrodes 10N, 20N, 30N are connected to the n-type connection pad 202N through the n-type wire 203N on the first carrier 200. The light-emitting units 10, 20, 30 are electrically connected to the same n-type connection pad 202N. In an embodiment, the size of the p-type electrode or the n-type electrode is between 55 μm and 85 μm, such as 70 μm, 75 μm, 80 μm or 82 μm. Or, the size of the p-type electrode or the n-type electrode is between 70 μm and 95 μm, such as 72 μm, 85 μm or 90 μm. The size can be the size of the width or the length of the p-type electrode or of the n-type electrode. The p-type electrodes 10P is connected to the p-type wire 203P1 on the first carrier 200, the p-type electrodes 20P is connected to the p-type wire 203P2 on the first carrier 200, and the p-type electrodes 30P is connected to the p-type wire 203P3 on the first carrier 200. The optical properties of the light-emitting units 10, 20, 30 can be controlled through different wires. The optical characteristic can be the light-emitting intensity of the light-emitting unit, the timing of controlling the light-emitting unit to emit light, and the light-emitting period of the light-emitting unit. To be specific, the optical characteristics of the light-emitting unit 10 can be controlled through the p-type wire 203P1 and the n-type wire 203N, the optical characteristics of the light-emitting unit 20 can be controlled through the p-type wire 203P2 and the n-type wire 203N, and the optical characteristics of the light-emitting unit 30 can be controlled through the p-type wire 203P3 and the n-type wire 203N. The n-type connection pad 202N and the p-type connection pad 202P are electrically connected to the electrical contact layer 201 on the bottom surface 200L through the conductive wires (not shown) embedded in the first carrier 200 to transmit an external control signal to the light-emitting unit. The p-type wires 203P1, 203P3 are connected to the p-type connection pads in other pixel area 100A and the external control signal can be transmitted to the light-emitting unit on the first carrier 200 through the conductive wires (not shown) in the first carrier 200, the p-type connection pad, and the p-type wires. In another aspect, the p-type wires 203P1, 203P3 are respectively connected to the light-emitting units of same color. For example, the p-type wire 203P1 is electrically connected to the light-emitting units 10, and the p-type wire 203P3 is electrically connected to the light-emitting units 30. In an embodiment, one of the conductive wires (not shown) embedded in the first carrier 200 is extending from the bottom surface 200L to the top surface 200T, and the extending direction of the conductive wire (not shown) is perpendicular to the top surface 200T of the first carrier 200. Referring to FIG. 3C, the receiving nodes 700L are arranged in a line on the left side of the bottom surface 200L, the receiving nodes 700R are arranged in a line on the right side of the bottom surface 200L, the receiving nodes 700U are arranged in a line on the upper side of the bottom surface 200L, and the receiving nodes 700B are arranged in a line on the bottom side of the bottom surface 200L. The receiving nodes 700L, 700R receive the external control signal for the p-type electrode and the receiving nodes 700U, 700B receive the external control signal for the n-type electrode. The arrangement of the receiving nodes 700L and the arrangement of the receiving nodes 700R are parallel with each other. The arrangement of the receiving nodes 700U and the arrangement of the receiving nodes 700B are parallel with each other. In an embodiment, the electrical characteristics test and the optical characteristics test can be performed when the light-emitting units 10, 20, 30 are connected to the first carrier 200 without completing subsequent manufacturing processes. When the light-emitting unit is determined to be abnormal under the electrical characteristics test or the optical characteristics test, the abnormal light-emitting unit or the abnormal first carrier 200 can be replaced. The abnormal situation of the light-emitting unit under test can be abnormal flashing or illuminating at the wrong time. It is noted that if the test is performed after covering the protective layer 40, it will be difficult to replace the light-emitting unit when the light-emitting unit is covered by the protective layer 40. If the test is performed after connecting the first carrier 200 and the second carrier 300 with light-emitting units 10, 20, 30 arranged on the first carrier 200, the first carrier 200 along with the light-emitting units 10, 20, 30 arranged thereon should be replaced when the first carrier 200 is abnormal. In that case, a large number of lighting units and the production time will be wasted.

Figure 4:
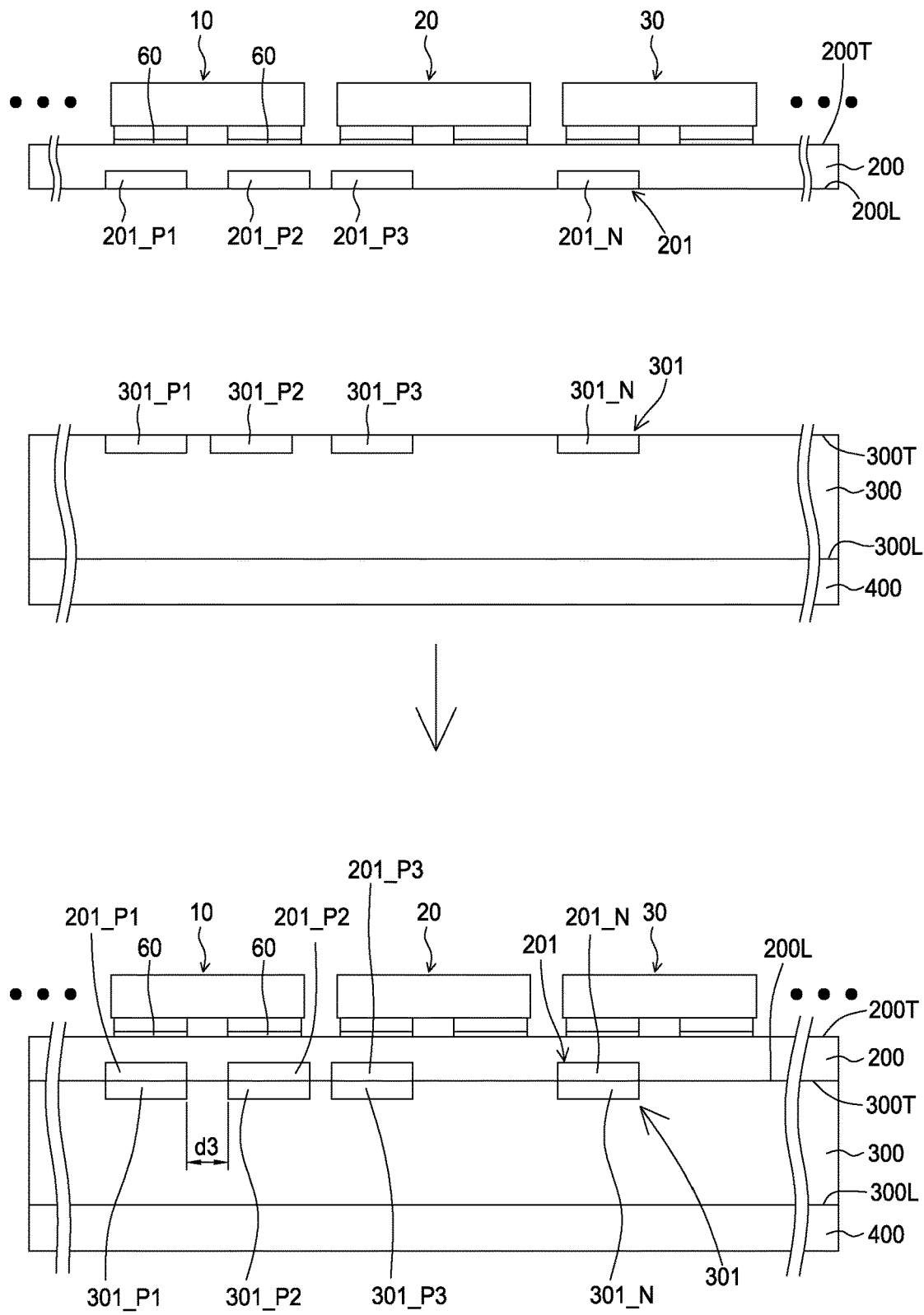
FIG. 4 shows a schematic view of manufacturing a display unit in accordance with one embodiment of the present disclosure.

FIG. 4 shows a schematic view of manufacturing a display unit in accordance with one embodiment of the present disclosure. Referring to FIG. 4, a second carrier 300 is provided after forming the structure in FIG. 3A. The electrical contact layer 400 is arranged below the bottom surface 300L of the second carrier 300 and the electrical contact layer 301 is arranged on the top surface 300T of the second carrier 300 as shown in FIG. 4. The electrical contact layer 301 includes an n-type connection pad 301_N and p-type connection pads 301_P1, 301_P2, 301_P3, and the sizes of the n-type connection pad and the p-type connection pad can be the same or different. In an embodiment, the electrical contact layer 301 on the second carrier 300 is connected to the electrical contact layer 201 through a conductive material. The conductive material can be solder, anisotropic conductive film (ACF) or anisotropic conductive paste (ACP). The light-emitting units can receive the external control signal sequentially through the conductive wire on the first carrier 200, the conductive wires (not shown) in the first carrier 200, the electrical contact layer 201, the electrical contact layer 301, the conductive wires (not shown) in the second carrier 300, and the electrical contact layer 400 to emit light. As shown in FIG. 4, the n-type connection pad 201_N is connected to the n-type connection pad 301_N, the p-type connection pad 201_P1 is connected to the p-type connection pad 301_P1, the p-type connection pad 201_P2 is connected to the p-type connection pad 301_P2, and the p-type connection pad 201_P3 is connected to the p-type connection pad 301_P3. The external control signal can be transmitted through the n-type connection pad and the p-type connection pad respectively to control the light-emitting units 10, 20, 30. In an embodiment, the composition of the first carrier 200 is different from that of the second carrier 300, and the minimum distance between two neighboring connection pads on the second carrier 300 or the minimum distance between two neighboring electrodes on the first carrier 200 is affected by the composition of the carrier. The minimum distance between two neighboring connection pads or electrodes is designed to avoid overflows of the material of two neighboring connection pads or electrodes during the manufacturing process. In an embodiment, the minimum distance between two neighboring connection pads on the second carrier 300 is larger than the minimum distance between two neighboring electrodes on the first carrier 200. The minimum distance between two neighboring connection pads or electrodes can be considered as the minimum distance between two neighboring light-emitting units. If the distance between two neighboring electrodes for connecting the light-emitting unit on the first carrier 200 is smaller than that between two neighboring connection pads on the second carrier 300, the density of the light-emitting units on the first carrier 200 is higher than that of the second carrier 300. In other words, the resolution of a display having a structure including light-emitting units arranged on a first carrier 200 is higher than a display having a structure including light-emitting units directly arranged on the second carrier 300. In addition, the distance between two neighboring connection pads of the same type on the second carrier 300 is substantially the same. For example, the distance d4 between the p-type connection pad 301_P1 and the p-type connection pad 301_P2 is substantially equal to the distance d5 between the p-type connection pad 301_P2 and the p-type connection pad 301_P3. In another embodiment, the p-type semiconductor layers of the light-emitting units 10, 20, 30 are commonly connected to a p-type connection pad to form a common p-type platform, and the n-type semiconductor layers of the light-emitting units 10, 20, 30 are connected to different n-type connection pads. As a whole, there are connection pads arranged on the top surface 300T and on the bottom surface 200L, and the sizes of the connection pads on the top surface 300T and on the bottom surface 200L can be the same or different. The top surface 300T of the second carrier 300 is connected to the first carrier 200 and the bottom surface 300L of the second carrier 300 is the surface away from the first carrier 200. In an embodiment, the entire electrical contact layer 201 is formed below the bottom surface 200L of the first carrier 200 and the entire electrical contact layer 301 is formed below the top surface 300T of the second carrier 300. In other words, the electrical contact layer 201 is protruded from the bottom surface 200L and the electrical contact layer 301 is embedded in the second carrier 300. In an embodiment, if the electrical contact layers 201 and the electrical contact layers 301 are thin and the first carrier 200 and/or the second carrier 300 can be bent, the first carrier 200 and the second carrier 300 are directly contacted with each other without being damaged while connecting the first carrier 200 and the second carrier 300.

Figure 5:
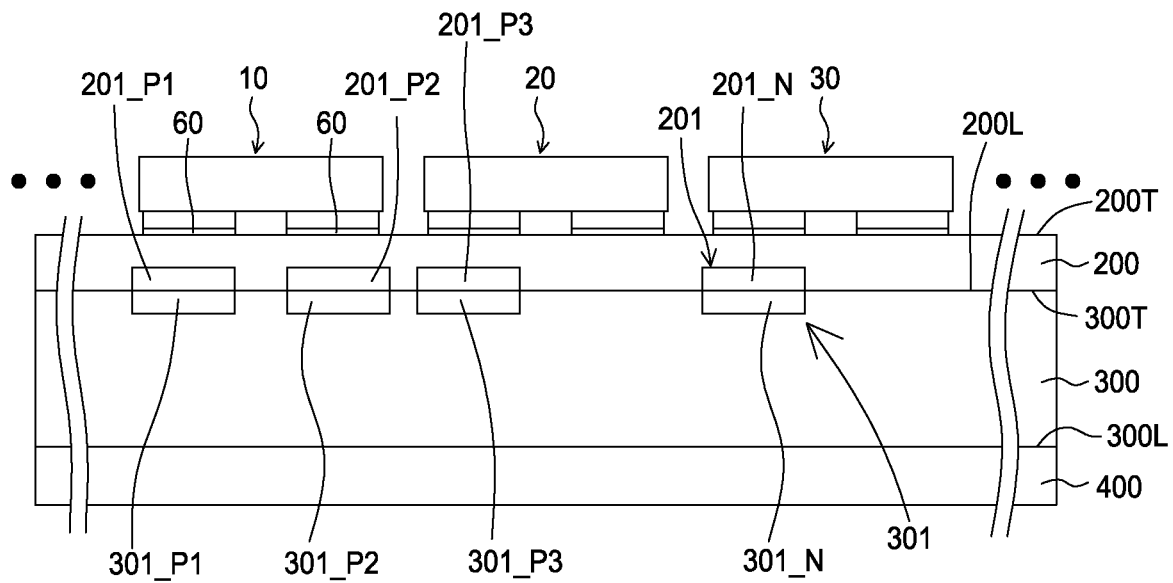
FIG. 5 shows a schematic view of manufacturing a display unit in accordance with one embodiment of the present disclosure.
Figure 5:
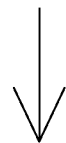
Figure 5:
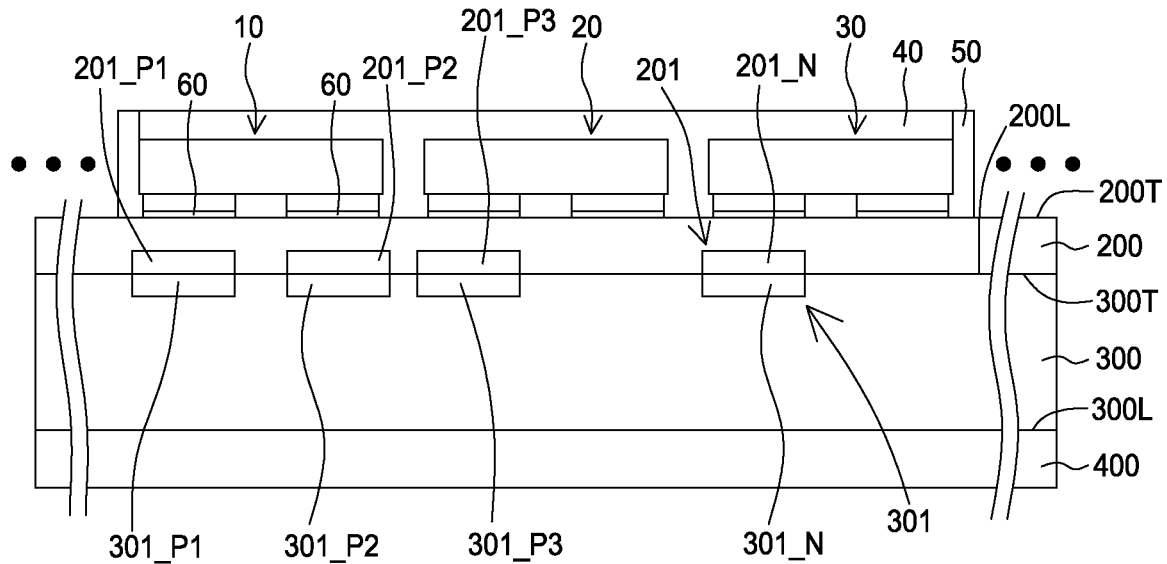

FIG. 5 shows a schematic view of manufacturing a display unit in accordance with one embodiment of the present disclosure. Referring to FIG. 5, the frame 50 is connected to the first carrier 200 and the material of the protective layer 40 is injected to the space between the frame 50 and the first carrier 200 to form the protective layer 40 after connecting the first carrier 200 to the second carrier 300. The frame 50 surrounds the light-emitting units 10, 20, 30. The protective layer 40 covers the light-emitting units 10, 20, 30 and is directly connected to the inner side of the frame 50 close to the light-emitting units 10, 20, 30. The protective 40 is filled in the space formed by the frame 50 and the first carrier 200. In another embodiment, the protective layer 40 covers the entire surface of the first carrier 200. In other words, the protective layer 40 covers the entire display unit in FIG. 5, covers the light-emitting units in the display unit, and covers the frame 50. The protective layer 40 further connects both the inner side and outer side of the frame 50. In another embodiment, the protective layer 40 covers a part of the top surface 200T of the first carrier 200, and the protective layer 40 connects both the inner side and outer side of the frame 50. The topmost surface of the protective layer 40 is coplanar with the topmost surface of the frame 50.

Figure 6A:
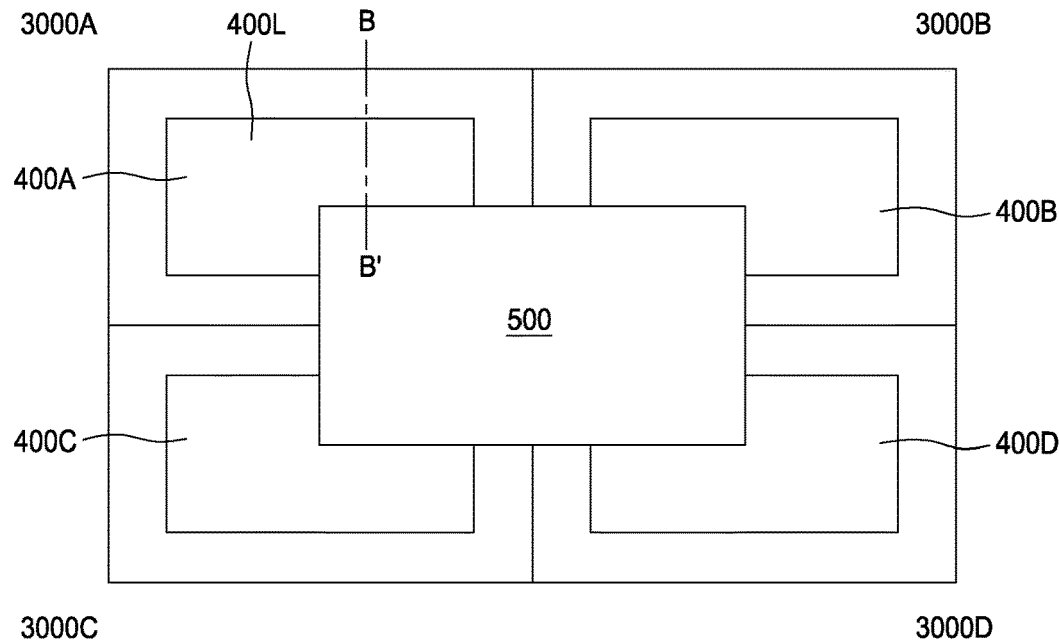
FIG. 6A shows a bottom view of a light-emitting diode display in accordance with one embodiment of the present disclosure.
Figure 6B:
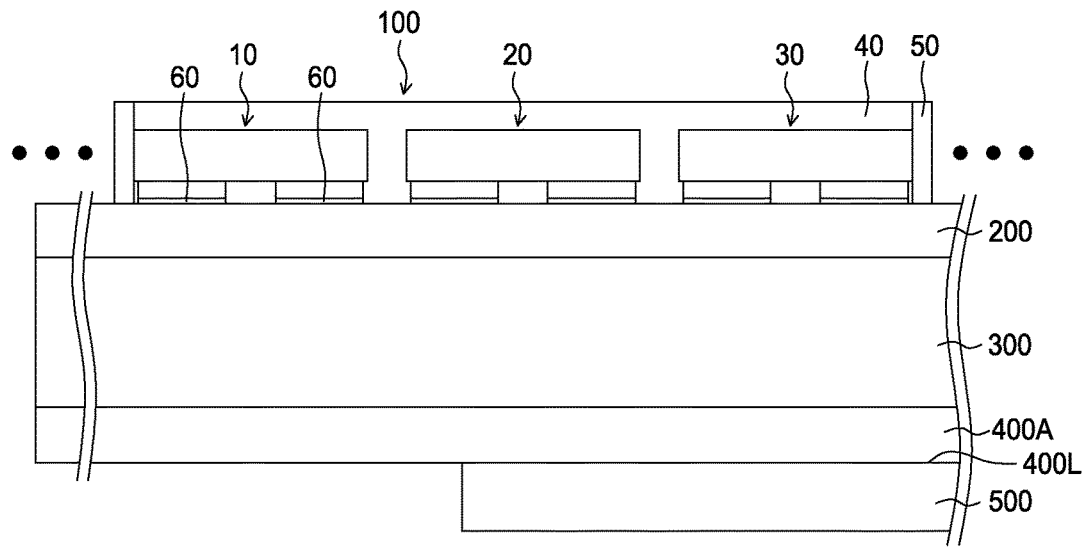
FIG. 6B shows a cross-sectional view of a light-emitting diode display in FIG. 6A.

FIG. 6A shows a bottom view of a light-emitting diode display in accordance with one embodiment of the present disclosure. FIG. 6B shows a cross-sectional view of a light-emitting diode display in FIG. 6A along the line BB'. The light-emitting diode display 20000 includes four display units 3000A, 3000B, 3000C, and 3000D and a control circuit 500. The control circuit 500 is placed approximately at the center of the light-emitting diode display 20000. The control circuit 500 is electrically connected to the display units 3000A, 3000B, 3000C, and 3000D through the electrical contact layers 400A, 400B, 400C, and 400D. The control circuit 500 sends control signals to the display units 3000A, 3000B, 3000C, and 3000D to show a specific figure. The control circuit 500 includes active electronic elements and passive electronic elements. The active electronic element includes switch element and control integrated chip (IC). The passive electronic element includes resistor and capacitor. FIG. 6B shows a cross-sectional view of a light-emitting diode display 20000 in FIG. 6A along the line BB'. The display unit 3000A, 300B, 3000C, 3000D is similar with the display unit 1000, and description about the display unit 1000 can be referred to previous sections. Referring to FIG. 6B, the electrical contact layer 400A has a bottom surface 400L connected to the control circuit 500, and a portion of the bottom surface 400L of the electrical contact layer 400A is exposed. The control circuit 500 is overlapped with the pixel unit in the display unit 3000A. In an embodiment, a portion of the control circuit 500 is not covered by the pixel unit. It is noted that the embodiment shown in FIGS. 6A, 6B can be incorporated into the light-emitting diode display 10000 and related embodiments shown in previous paragraphs.

Figure 7:
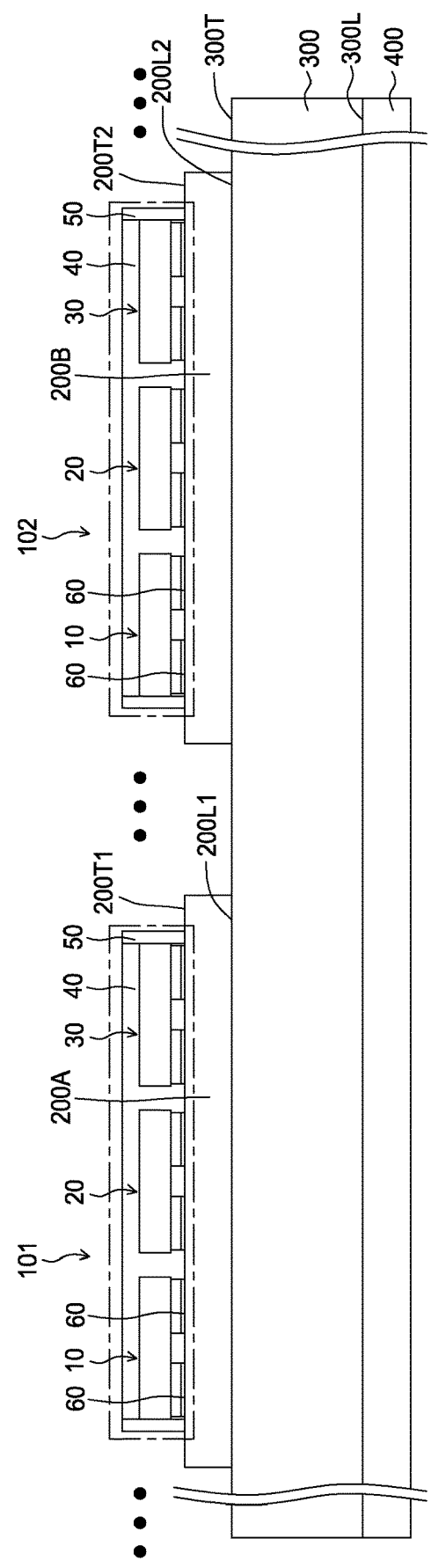
FIG. 7 shows a cross-sectional view of a display unit in accordance with one embodiment of the present disclosure.

FIG. 7 shows a cross-sectional view of a display unit in accordance with one embodiment of the present disclosure. Referring to FIG. 7, the display unit 4000 includes an electrical contact layer 400, a second carrier 300, a third carrier 200A, a fourth carrier 200B, a first pixel unit 101, and a second pixel unit 102. The third carrier 200A has a top surface 200T1 and a bottom surface 200L1. The fourth carrier 200B has a top surface 200T2 and a bottom surface 200L2. The bottom surface 200L1 of the third carrier 200A or the bottom surface 200L2 of the fourth carrier 200B is smaller than the top surface 300T of the second carrier 300. The structure of the first pixel unit 101 and the structure of the second pixel unit 102 are similar with that of the pixel unit 100, and the description about the pixel unit 100 can be referred to previous paragraphs. The protective layer 40 covers the light-emitting units 10, 20, 30 and is directly connected to the inner side of the frame 50 close to the light-emitting units 10, 20, 30. The topmost surface of the protective layer 40 is substantially coplanar with the topmost surface of the frame 50. The protective layer 40 is arranged in the space formed by the frame 50 and the third carrier 200A, and in the space formed by the frame 50a and the fourth carrier 200B. In another embodiment, the protective layer 40 covers the entire surface of the second carrier 300. In other words, the protective layer 40 covers the entire display unit in FIG. 7, and connects both the inner side and outer side of the frame 50. The protective layer 40 covers the frame 50. In another embodiment, the protective layer 40 covers at least two light-emitting units and is directly connected to the inner side and the outer side of the frame 50, and a portion of the top surface 300T of the second carrier 300 is not covered by the protective layer 40.

The pixel units 101, 102 in the display unit 4000 are connected to the carriers 200A, 200B through the conductive layer 60. The external control signal is transmitted to different pixel units through different carriers. To be more specific, the external control signal is transmitted through the electrical contact layer 400, the second carrier 300, and the third carrier 200A to control the pixel unit 101. Or, the external control signal is transmitted through the electrical contact layer 400, the second carrier 300, and the fourth carrier 200B to control the pixel unit 102. On the contrary, the pixel units in the display unit 1000 shown in FIGS. 2A, 2B are arranged on the first carrier 200 so the external control signal to control the pixel units and the conductive wires for transmitting the external control signal pass through the first carrier 200. The external control signals related to different pixel units in the display unit 4000 are transmitted through different carriers 200A, 200B, and each of the carriers 200A, 200B supports only one pixel unit. Therefore, the arrangement of the conductive wires (not shown) embedded in the carrier 200A or embedded in the carrier 200B is simpler than the arrangement of the conductive wire (not shown) embedded in the carrier 200 in the display unit 100. Moreover, the distance between the conductive wires (not shown) within the carriers 200A, 200B can be enlarged to avoid interference between external control signals on the wires while transmitting the external control signals. In an embodiment, the electrical characteristics test and the optical characteristics test can be performed after connecting the pixel units to the carrier 200A, 200B. If the pixel units function well under the electrical characteristics test and the optical characteristics test, the pixel units along with the carriers 200A, 200B are connected to the carrier 300. When one pixel unit in the display unit 4000 is abnormal, the pixel unit can be easily replaced. For example, if a pixel unit 101 is determined to be abnormal, the abnormal pixel unit 101 along with the third carrier 200A supporting the abnormal pixel unit 101 can be replaced by a normal pixel unit and carrier. On the contrary, the entire carrier 200 and the pixel units on the carrier 200 are replaced when one pixel unit in the display unit 1000 is abnormal because the structure of the display unit 1000 is not allowed to replace only one pixel unit along with the carrier below. The abnormal display unit 4000 can be fixed by replacing the carrier and the pixel unit above. For example, the abnormal pixel unit 101 and the third carrier 200A can be replaced without affecting the function of pixel unit 102 and the fourth carrier 200B. In an embodiment, the display unit 4000 includes multiple carriers, and each of the carriers supports at least two pixel units. It is noted that the embodiment shown in FIGS. 6A, 6B can be incorporated to the display unit 4000 by connecting a control circuit 500 to the electrical contact layer 400.

Figure 8:
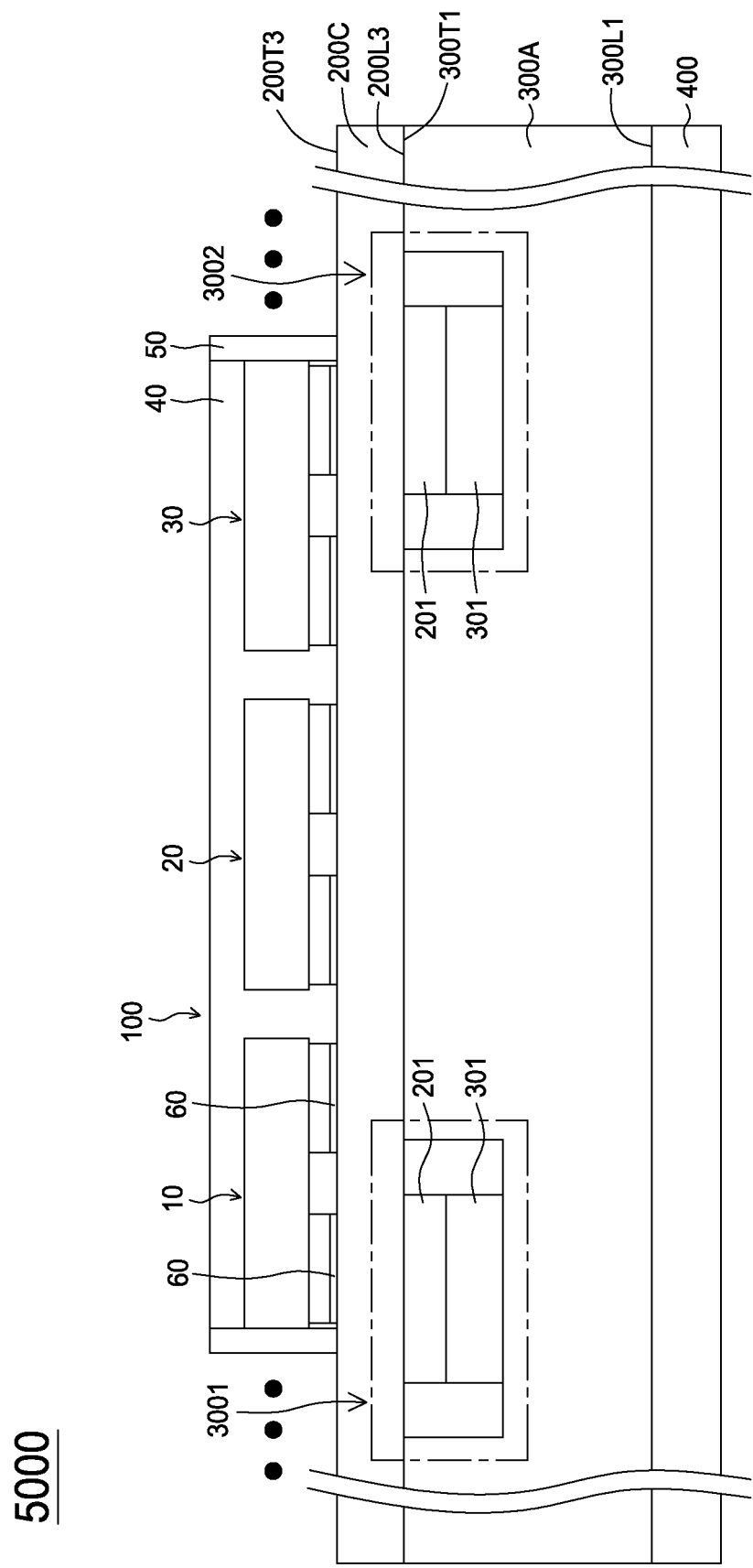
FIG. 8 shows a cross-sectional view of a display unit in accordance with one embodiment of the present disclosure.

FIG. 8 shows a cross-sectional view of a display unit in accordance with one embodiment of the present disclosure. Referring to FIG. 8, the display unit 5000 includes an electrical contact layer 400, a fifth carrier 300A, a sixth carrier 200C, an electrical contact layer 201, an electrical contact layer 301, and a pixel unit 100. The fifth carrier 300A has a top surface 300T1 and a bottom surface 300L1. The sixth carrier 200C has a top surface 200T3 and a bottom surface 200L3. An electrical contact layer 201 is arranged below the bottom surface 200L3 of the sixth carrier 200C. Two cavities 3001, 3002 are formed on the fifth carrier 300A at the side of the top surface 300T1, and the electrical contact layer 301 is formed in the cavities 3001, 3002. The electrical contact layer 301 can be connected to the electrical contact layer 201 through the conductive material. The conductive material can be solder. The external control signal can be transmitted to control the pixel unit 100 through the electrical contact layer 400, the fifth carrier 300A, and the sixth carrier 200C. The electrical contact layer 301 and the electrical contact layer 201 can include n-type connection pad and p-type connection pad to connect to the light-emitting unit 10, 20, 30 for transmitting the external control signal. Related descriptions and structures about electrical contact layer 201, 301 can be referred to previous paragraphs and FIGS. 3A, 4, 5, and are omitted for brevity. In an embodiment, the conductive material can be solder, anisotropic conductive film (ACF), or anisotropic conductive paste (ACP). The protective layer 40 covers the light-emitting units 10, 20, 30 and is directly contacted with the inner side of the frame 50 close to the light-emitting units 10, 20, 30. In another aspect, the protective layer 40 is filled in the space formed by the frame 50 and the sixth carrier 200C. In another embodiment, the protective layer 40 covers the entire surface of the sixth carrier 200C and the entire display unit 5000. The protective layer 40 is contacted with both the inner side and the outer side of the frame 50. Furthermore, the protective layer 40 covers all light-emitting units in the display unit 5000 and the topmost surface of the frame 50. In another embodiment, the display unit 5000 includes at least two protective layers 40 which are not contacted with each other. One of the protective layers 40 is contacted with both the inner side and the outer side of the frame 50. The electrical contact layer 201 is formed entirely in the cavities 3001, 3002 when the fifth carrier 300A and the sixth carrier 200C are connected with each other. The bottom surface 200L3 of the sixth carrier 200C is directly connected to the top surface 300T1 of the fifth carrier 300A. In an embodiment, the insulating material is filled in the gap between the fifth carrier 300A and the sixth carrier 200C to enhance the connection between the fifth carrier 300A and the sixth carrier 200C. The gap includes the cavities 3001, 3002. The insulating material can be silicone or epoxy. Furthermore, the strength of connection between the electrical contact layers 201, 301 can be enhanced by including the insulating material. In another aspect, the connection between the fifth carrier 300A and the sixth carrier 200C may cause the sixth carrier 200C to be deformed so the top surface 200T3 of the sixth carrier 200C become convex. However, the arrangement of the cavities 3001, 3002 can reduce the degree of the deformation of the top surface 200T3 of the sixth carrier 200C by providing a space for connecting the electrical contact layers 201, 301.

The foregoing description has been directed to the specific embodiments of this disclosure. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A display unit, comprising:
   a first carrier comprising a bottom contact layer;
   a first electrical contact layer embedded in the first carrier, wherein the first electrical contact layer and the bottom contact layer are arranged on opposite sides of the first carrier;
   a second carrier formed on the first carrier, and comprising a top surface, a bottom surface opposite the top surface, and a first connection pad arranged under the bottom surface in a configuration of connecting to the first electrical contact layer through a conductive material; and
   a pixel unit arranged on the top surface of the second carrier and electrically connected to the first electrical contact layer for emitting different color lights, and comprising two or more light-emitting units, and a protective layer covering the light-emitting units.

2. The display unit of claim 1, further comprising a frame surrounding the light-emitting units.

3. The display unit of claim 2, wherein the frame comprises an opaque material.

4. The display unit of claim 2, wherein the frame directly contacts the protective layer, and has a topmost surface higher than the light-emitting units.

5. The display unit of claim 1, further comprising a second electrical contact layer embedded in the first carrier.

6. The display unit of claim 5, the second carrier further comprises a second connection pad arranged under the bottom surface in a configuration of electrically connecting to the second electrical contact layer.

7. The display unit of claim 6, wherein each of the light-emitting units comprises a first electrode and a second electrode connected to the second carrier.

8. The display unit of claim 7, wherein the first connection pad and the second connection pad are separated from each other by a distance larger than a distance between the first electrode and the second electrode.

9. The display unit of claim 1, wherein the different color lights comprises a red light, a green light, and a blue light.

10. The display unit of claim 1, wherein the conductive material comprises solder, anisotropic conductive film (ACF) or anisotropic conductive paste (ACP).

* * * * *